United States Patent [19]

Lee et al.

[11] Patent Number: 5,144,160

[45] Date of Patent: Sep. 1, 1992

[54] FULLY DIFFERENTIAL SAMPLE AND HOLD ADDER CIRCUIT

[75] Inventors: Kuang-Lu Lee; Shean-Yih Chiou, both of Taipei, Taiwan

[73] Assignee: Acer Incorporated, Taiwan, Taiwan

[21] Appl. No.: 600,526

[22] Filed: Oct. 19, 1990

[51] Int. Cl.[5] ...................... H03K 5/153; H03K 5/22; H03K 5/159

[52] U.S. Cl. .................................. 307/353; 307/494; 307/596

[58] Field of Search ............... 307/352, 353, 494, 529, 307/596

[56] References Cited

U.S. PATENT DOCUMENTS

| | | | |
|---|---|---|---|
| 4,553,052 | 11/1985 | Takahashi | 307/494 |
| 4,587,443 | 5/1986 | Van De Plassche | 307/494 |
| 4,707,624 | 11/1987 | Yee | 307/494 |
| 4,899,068 | 2/1990 | Klose et al. | 307/494 |
| 4,988,900 | 1/1991 | Fensch | 307/494 |
| 5,028,815 | 7/1991 | Van De Plassche | 307/494 |

FOREIGN PATENT DOCUMENTS 0217284 6/1988 European Pat. Off. .

OTHER PUBLICATIONS

Nicollini et al., "A Fully Differential Sample and Hold Circuit for High-Speed Applications," IEEE Journal of Solid-State Circuits, vol. 24, No. 5, 1989.

Yung et al., "A Ratio-Independent Cyclic A/D Conversion Technique," IEEE International Symposium on Circuits and Systems, vol. 3, Jun. 1988, pp. 2581-2584.

*Primary Examiner*—Eugene R. LaRoche
*Assistant Examiner*—Evelyn A. Lester
*Attorney, Agent, or Firm*—Greg T. Sueoka

[57] ABSTRACT

A fully differential sample and hold, switched-capacitor adder circuit is disclosed, where a single-ended and fully differential signals can be added together. Thus in one single operation, the adder circuit performs two functions conventionally performed by two separate circuits: converting the single-ended voltage signal into fully differential; and adding this converted differential signal to another differential signal. The adder circuit includes an operational amplifier, capacitors and switches for performing the operation. The circuit is economical when implemented in silicon.

5 Claims, 9 Drawing Sheets

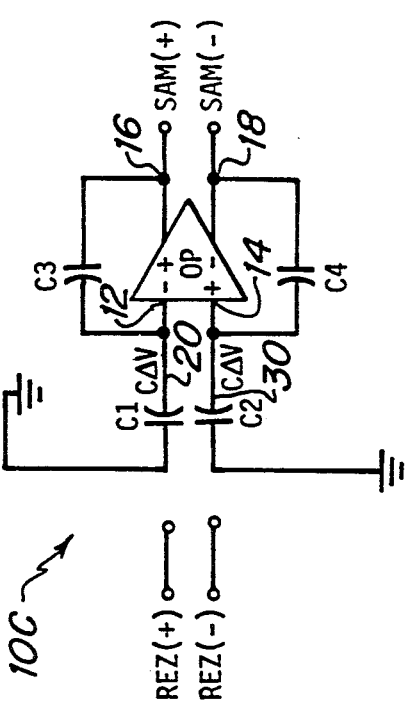
TABLE 3A
|   | LEFT HAND PLATE | RIGHT HAND PLATE |
|---|---|---|
| C1 | $C(V - V_p)$ | $C(V_p - V)$ |
| C2 | $C(-V + V_p)$ | $C(-V_p + V)$ |
| C3 | $C(\Delta V - V_p)$ | $C(V_p - \Delta V)$ |
| C4 | $C(\Delta V + V_p)$ | $C(-V_p - \Delta V)$ |
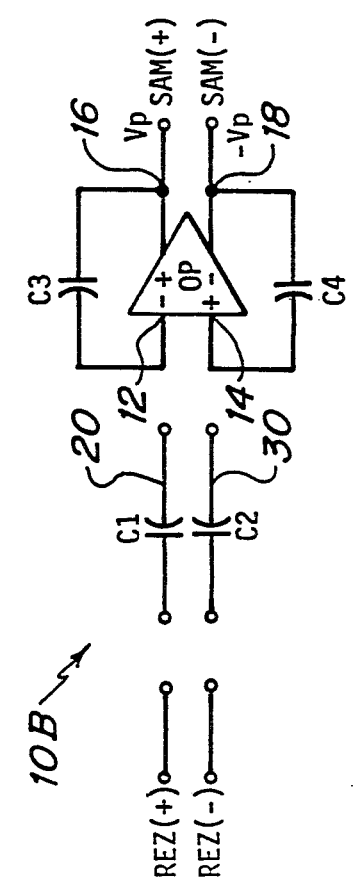
Figure 3D (PRIOR ART)
Figure 3C (PRIOR ART)
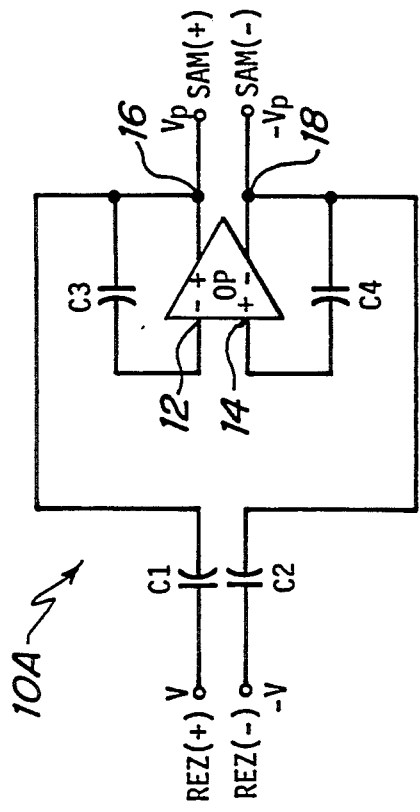
Figure 3A (PRIOR ART)
Figure 3B (PRIOR ART)

FULLY DIFFERENTIAL SAMPLE AND HOLD ADDER CIRCUIT

BACKGROUND OF THE INVENTION

This invention relates to sample and hold circuits and in particular to a fully differential sample and hold adder circuit which is especially useful in analog integrated circuit design.

To avoid the adverse effects of noise in single-ended operational amplifier, it is well-known that a fully differential circuit may be used to avoid such effects and maintain an accurate output. Thus in analog signal processing, fully differential circuits are frequently used. In particular, in conversions between digital and analog signals, fully differential sample and hold circuits have often been used to achieve the conversion and to maintain accurate outputs.

In many applications, it is desirable to be able to add a fully differential signal to a single-ended voltage signal. Single-ended signals, in contrast to fully differential signals, are explained in "Microelectronic Circuits," by Adel S. Sedra and Kenneth C. Smith, published by CBS College Publishing, New York. In conventional fully differential sample and hold circuit design, this is usually accomplished by connecting the single-ended signal through a single-ended to fully differential converter and an adder circuit. When such configuration is implemented in integrated circuits, the above-described design requires considerable area in the semiconductor medium while its accuracy is less than ideal. The additional circuit required for such design, in addition to extra silicon area, reduces the speed of the circuit, which may cause difficulties for certain applications. It is therefore desirable to provide an improved fully differential sample and hold circuit which permits the addition of a single-ended signal and a fully-differential signal where the above-described difficulties are not present.

SUMMARY OF THE INVENTION

This invention is based on the observation that capacitor means and switch means may be used to connect a single-ended signal Vaux and fully differential signals V and $-V$ to an operational amplifier having a first and a second output so that the amplifier provides at its two outputs two output signals whose difference is substantially $aV+bVaux$, where a, b are constants determined by the capacitor means. In the preferred embodiment, the capacitor means includes a plurality of capacitors and the switch means connects the single-ended signal through some of the capacitors to a first output of the amplifier at a first point in time and, at a second point in time subsequent to the first point in time, connects the single-ended signal through other capacitors of the capacitor means to an input of the amplifier so that the amplifier provides said two output signals. Therefore, the sample and hold adder circuit of this invention requires no single-ended to fully differential converter. Capacitors and switches employed require little area when the circuit is implemented in a semiconductor medium.

In accordance with the preferred embodiment of the invention, the fully differential sample and hold circuit of this invention comprises an operational amplifier having a first and a second output, and a first and a second input, a first capacitor C1 and a second capacitor C5 for coupling respectively a first and a second circuit input to a first path; and a third capacitor C2 and a fourth capacitor C6 for coupling a third and a fourth circuit input to a second path. The circuit includes a first feedback means comprising a fifth capacitor C3 connecting the first input and the first output of the amplifier, and a second feedback means comprising a sixth capacitor C4 connecting the second input and the second output of the amplifier. The circuit also includes a seventh capacitor C7 and an eighth capacitor C8, and a switch means.

At a first point in time, the switch means connects a single-ended voltage Vaux and a voltage V to the first and second circuit inputs respectively, connecting respectively a voltage $-V$ and a reference voltage to the third and fourth circuit inputs, connecting the seventh capacitor between the first amplifier output and the reference voltage or the first amplifier input, connecting the eighth capacitor between the second amplifier output and the reference voltage or the second amplifier input, and connecting the first and second paths to the first and second amplifier outputs respectively.

At a second point in time subsequent to the first, the switch means connects the first, second and third inputs to the reference voltage and the fourth circuit inputs to the single-ended voltage Vaux, connecting the first and second paths to the first and second inputs respectively, connecting the seventh capacitor between the first amplifier input and the reference voltage, and connecting the eighth capacitor between the second amplifier inputs and the reference voltage. This causes the difference in voltage potential between the two amplifier outputs to be about $aV+bVaux$, where a, b are determined by the capacitors $C_1$ through $C_8$.

BRIEF DESCRIPTION OF THE DRAWINGS

FIGS. 3A-3C are schematic circuit diagrams illustrating the operation of the circuit of FIG. 1 by the clock circuits of FIG. 2.

FIG. 3D is a table illustrating the charges on the plates of capacitors C1-C8 in FIG. 3A.

DETAILED DESCRIPTION OF THE INVENTION

Figure 1:
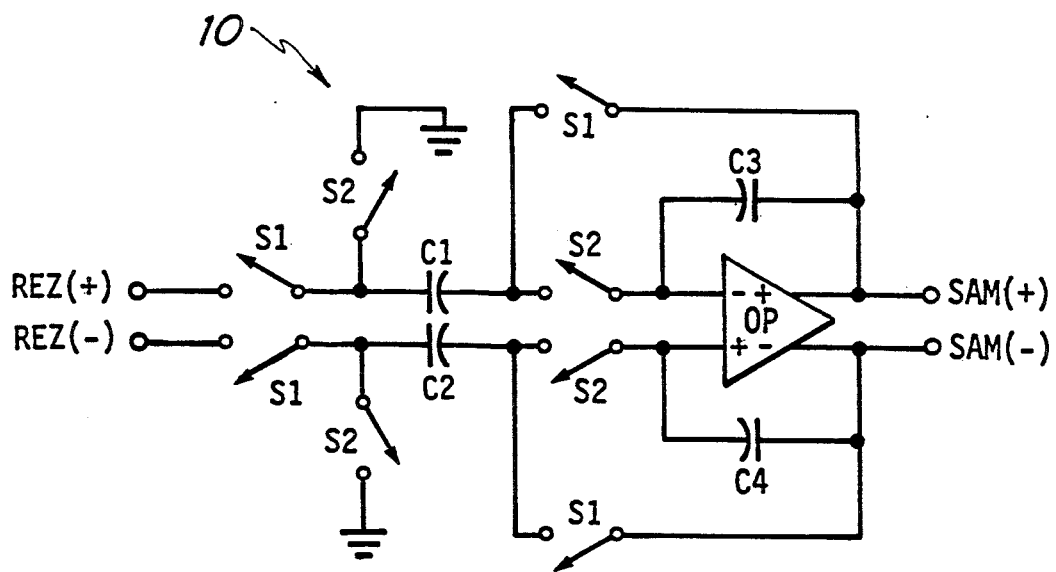
FIG. 1 is a schematic circuit diagram of a basic fully differential sample and hold circuit illustrating a conventional design.

FIG. 1 is a schematic circuit diagram of a fully differential sample and hold circuit of a conventional design. As shown in FIG. 1, capacitors C1-C4 are capacitors having substantially the same capacitance and S1 and S2 are switches operated by non-overlapping clocks such as that shown in FIG. 2. OP is an operational amplifier. REZ(+) and REZ(−) represent respectively the positive and negative return to zero input signals of the fully differential logic. SAM(+) and SAM(−) represent respectively the positive and negative output signals of the fully differential sample and hold circuit 10.

Figure 2:
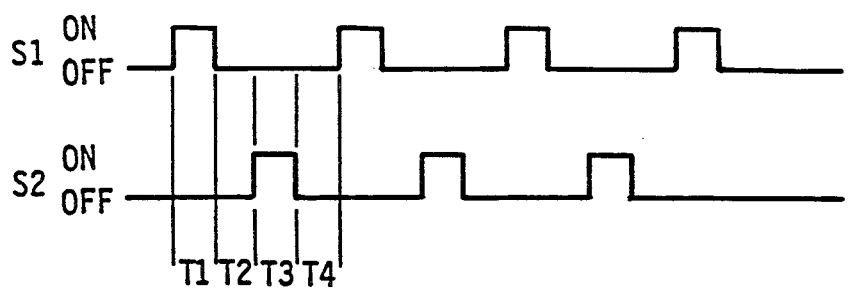
FIG. 2 is a timing diagram of two clock signals for operating the switches in the circuit of FIG. 1.

Switches S1, S2 are operated by two non-overlapping clock signals shown in FIG. 2 alongside the labels S1 and S2. The operation of FIG. 1 is illustrated in more detail in reference to FIGS. 2 and 3A-3D. During the time period T1, switches S1 are on and switches S2 are off in FIG. 1, so that circuit 10 becomes the same as circuit 10A in FIG. 3A. In a normal fully differential system, the magnitude of signals in one-half of the circuit is the same as those in the other half except that the polarities of the signals are reversed. Thus in FIGS. 1 and 3A-3C, the magnitudes of the signals in the upper half (including input 12, output 16) of the circuit 10 are the same as those in the lower half except that the polarities are opposite between the two halves. Hence assuming that the outputs SAM(+) and SAM(−) during the time period immediately before T1 are Vp, −Vp respectively, the difference between the two outputs at such time is 2Vp.

Where the return to zero positive and negative inputs REZ(+), REZ(−), are V and −V respectively, it is desirable for the potential difference between the two outputs to be 2V. The operational amplifier OP has an offset voltage ΔV, and the input impedance of the operational amplifier OP is infinite. Therefore, the amount of electrical charges on the left and right plates of capacitors C1-C4 may be obtained and are listed in the table in FIG. 3D.

During time T2, all switches S1, S2 are open, so that circuit 10 of FIG. 1 becomes the same as circuit 10B in FIG. 3B. The two outputs of the circuit remain Vp, −Vp, so that the difference is 2Vp, which is maintained during a hold state.

During time T3, switches S2 are closed and switches S1 are open, so that circuit 10 becomes the same as circuit 10C in FIG. 3C. The operational amplifier OP has infinite input impedance and low output impedance. Hence substantially no current flows into or out of the two inputs 12, 14 of the amplifier, but current may flow into or out of the two outputs 16, 18. In reference to FIG. 3B, the plate of capacitor C1 on the righthand side (hereinafter referred to the "righthand plate" of C1) is connected to a first path 20 and that of capacitor C2 is connected to a second path 30.

At time T3, path 20 is connected to input 12 of the amplifier and path 30 is connected to input 14 of the amplifier as shown in FIG. 3C. As shown in FIGS. 3B and 3C, the plate of capacitor C3 on the lefthand side ("lefthand plate" of C3) is also connected to input 12 at all times and the lefthand plate of capacitor C4 is connected to input 14 at all times. Thus when paths 20, 30 are connected to inputs 12, 14 respectively, while electrical charges may flow between the righthand plates of capacitors C1, C2 and the lefthand plates of capacitors C3, C4, the sum total of the electrical charges on such four plates remain the same because of the principal of conservation of electrical charges.

In reference to FIGS. 3A and 3B, when paths 20, 30 are disconnected from outputs 16, 18 respectively at time T2, the electrical charges on the above-described four capacitor plates remain unchanged. Hence the sum total of the electrical charges on such four plates in circuit 10A during time T1 is the same as the sum total of electrical charges on the same four plates at time T3 in circuit 10C. In reference to FIG. 3C, the lefthand plates of capacitors C1, C2 are connected to ground, so that the electrical charges on the righthand plates of these capacitors are each CΔV. The electrical charges on the lefthand and righthand plates of C1-C4 at time T1 are listed in FIG. 3D. In FIG. 3A, the sum total of the electrical charges on the righthand plate of C1 and lefthand plate of C3 is:

$$C(V_p - V) + C(\Delta V - V_p) = -CV + C\Delta V \quad (1)$$

where the capacitance of each of C1-C4 is assumed to be C.

Hence during time T3, that is in circuit 10C of FIG. 3C, the electrical charge on the lefthand plate of capacitor C3 is:

$$(-CV + C\Delta V) - C\Delta V = -CV \quad (2)$$

Therefore, the electrical charge on the righthand plate of capacitor C3 is CV, so that output SAM(+) is V+ΔV, since the amplifier OP introduces an offset voltage. Similarly, the sum total of electrical charges on the righthand plate of C2 and lefthand plate of C4 is:

$$C(-V_p + V) + C(\Delta V + V_p) = CV + C\Delta V \quad (3)$$

During time T3, the lefthand plate of capacitor C4 is:

$$(CV + C\Delta V) - C\Delta V = CV \quad (4)$$

Thus the righthand plate of C4 is −CV, so that the output SAM(−) is −V+ΔV and the potential difference between the two outputs has changed to 2V. In other words, during time T3, circuit 10 accomplished the function of sampling the signal fed to the circuit during time T1. During time T4, all switches are off so that the outputs of the circuit remain the same and their difference 2V remains unchanged to achieve the holding function of the circuit.

Figure 4:
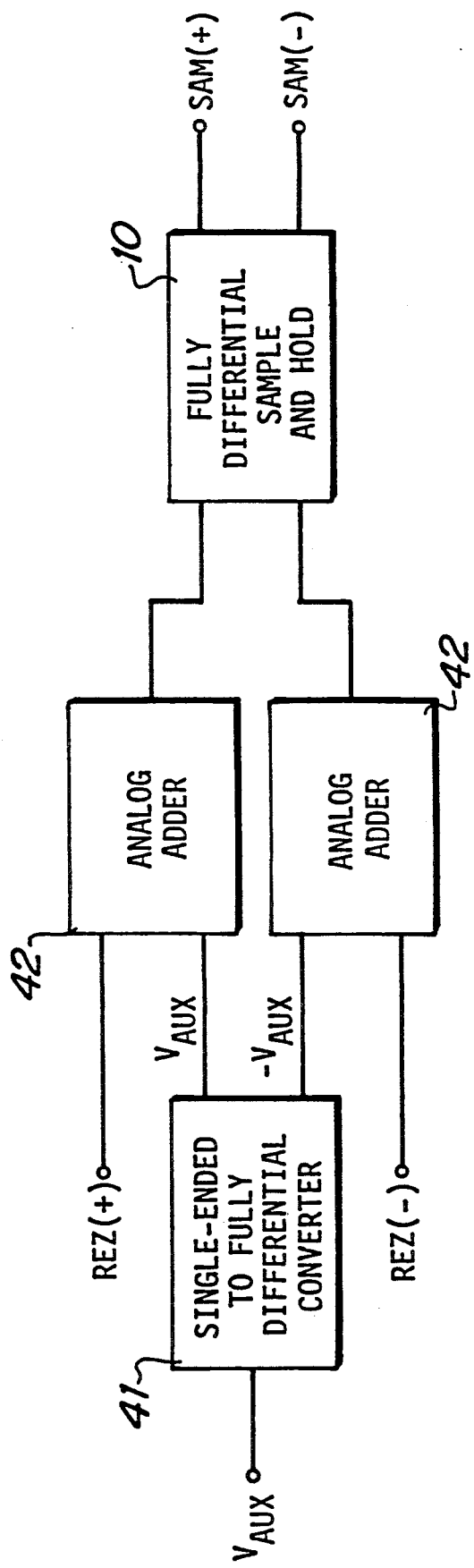
FIG. 4 is a block diagram of a fully differential sample and hold adder circuit and of other associated circuitry to enable the addition of a fully differential signal and a single-ended signal to illustrate a conventional design.

In many applications, it is desirable to be able to add a single-ended signal in addition to the input voltages V, −V. In conventional design, this is accomplished by connecting the fully differential sample and hold circuit to two adders in the configuration shown in FIG. 4. As shown in FIG. 4, the auxiliary signal Vaux is first fed to a single-ended to fully differential converter 41 to convert the single input Vaux to two signals of opposite polarity: Vaux and −Vaux. These two outputs are added to the normal inputs REZ(+), REZ(−) through analog adders 42 and the summed signals fed to the fully differential sample and hold circuit 10 to obtain the two outputs with the adjusted potential difference between them.

The design of FIG. 4 is uneconomical. When implemented in integrated circuits, resistors require considerable areas in a semiconductor medium while the accuracy achievable is less than desirable. If the design of FIG. 4 is used, the single-ended to fully differential converter requires two operational amplifiers and two resistors. The two adders 42 each requires an operational amplifier and three large resistors. Obviously, such a large number of amplifiers and resistors will occupy large areas on the silicon wafer. Furthermore, such design cannot achieve high accuracy. In addition, the design of FIG. 4 involves three logic levels so that its speed may be too slow for many applications. It is therefore desirable to provide an improved fully differential sample and hold circuit where the above-described disadvantages are not present.

Figure 5:
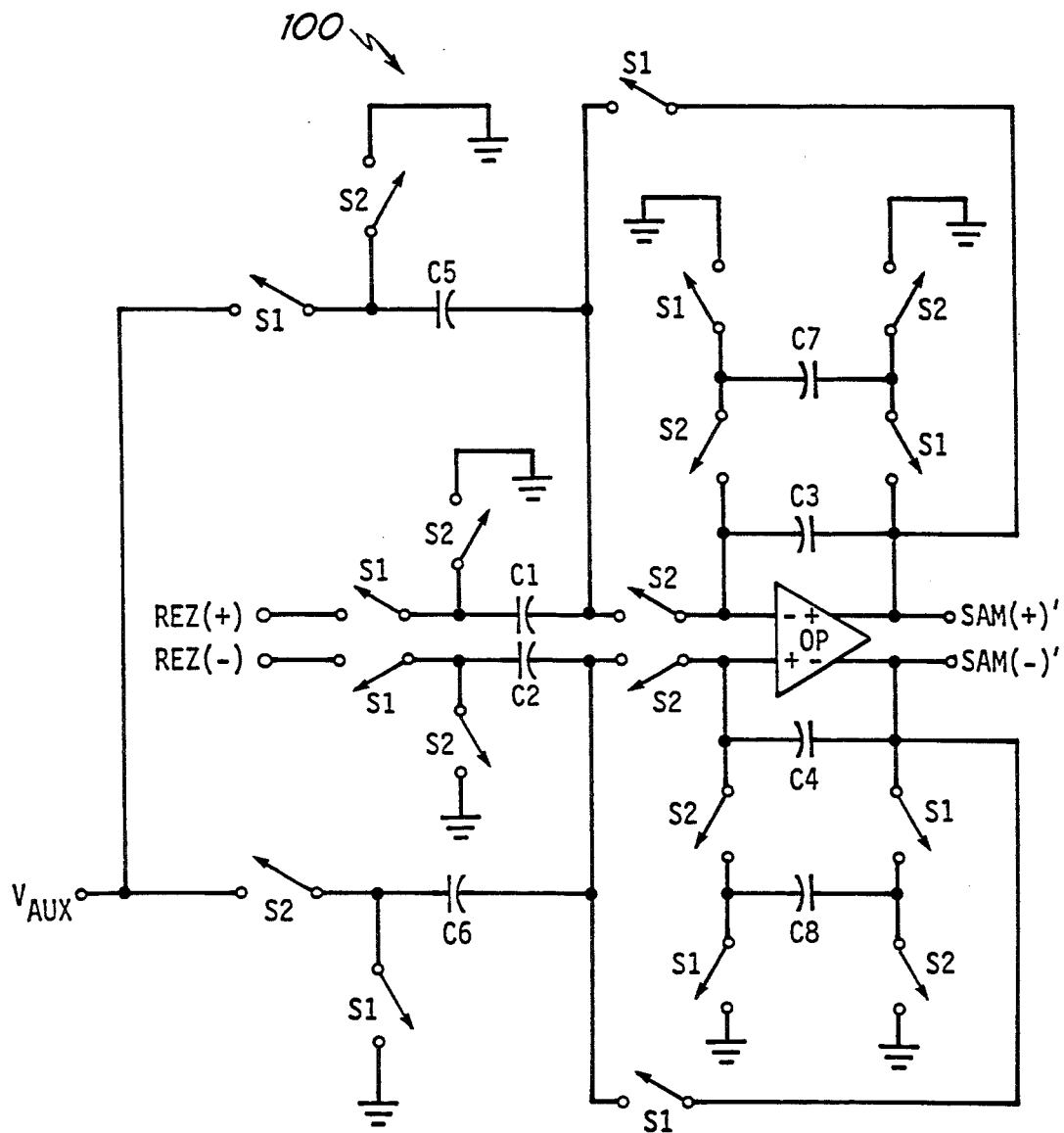
FIG. 5 is a schematic circuit diagram of a fully differential sample and hold adder circuit to illustrate a first embodiment of the invention.

FIG. 5 is a schematic circuit diagram of a fully differential sample and hold circuit to illustrate a first embodiment of the invention. As clearly shown in FIG. 5, circuit 100 includes only one operational amplifier and no resistors, where the remaining components are capacitors or switches. As explained in detail below, circuit 100 permits adjustments of the output in response to a single-ended input signal Vaux. Therefore, circuit 100 is advantageous over circuit 10 in that it requires much less area in the semiconductor medium and is more accurate.

In circuit 100, for ease of illustration, capacitors C1–C8 are assumed to have substantially the same capacitance C. S1 indicates a group of switches which are turned on at different times from the group S2 of switches. In the preferred embodiment illustrated in FIG. 5, switches S1 are turned on when the clock signal shown next to S1 in FIG. 2 and applied to S1 is high, but are turned off when such clock signal is low. Similarly, switches S2 of FIG. 5 are turned on when the corresponding clock signal is high but are turned off when such clock signal is low in FIG. 2. As shown in FIG. 2, the clock signals for operating switches S1, S2 do not overlap. As before, REZ(+), REZ(−) represent the return to zero positive and negative input signals in FIG. 5.

Figures 6A, 6D:
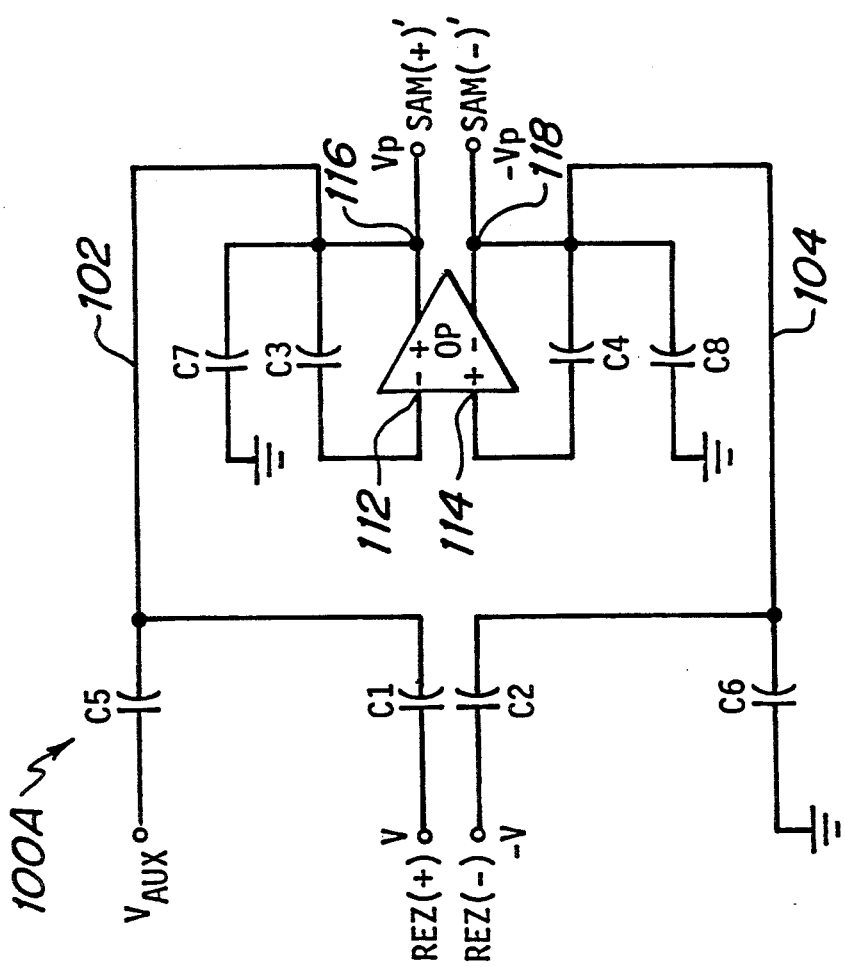
FIGS. 6A-6C are schematic circuit diagrams for illustrating the operation of the circuit of FIG. 5.
FIG. 6D is a table illustrating the charges and capacitors C1-C8 in FIG. 6A.
Figure 6B:
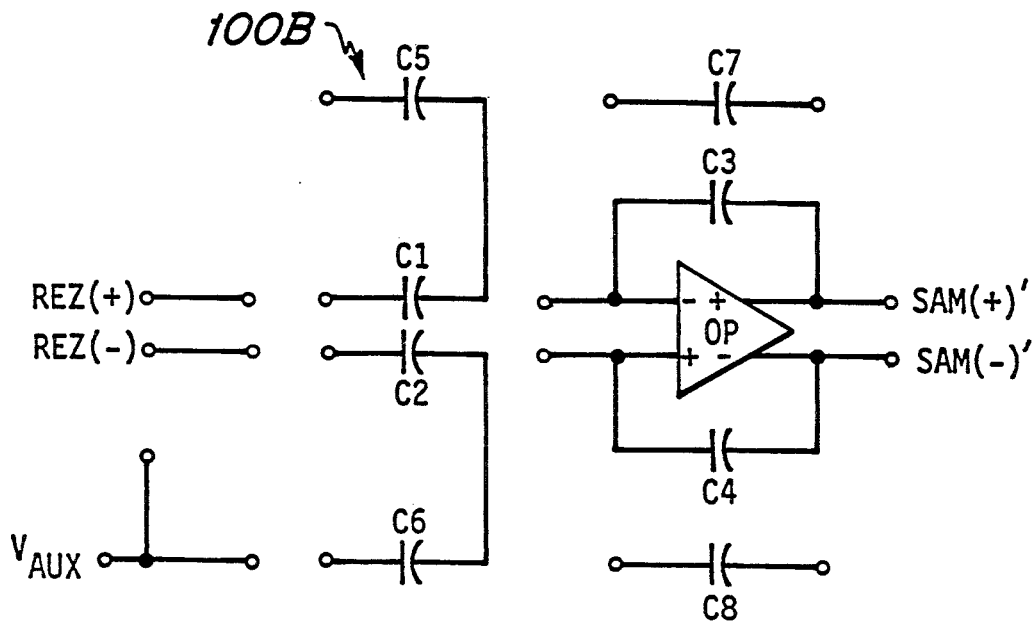

The operation of circuit 100 is illustrated by means of the schematic circuit diagrams in FIGS. 6A–6D, the table in FIG. 6D, and the timing diagram in FIG. 2.

At time T1, switches S1 are turned on and switches S2 are turned off in FIG. 5 so that circuit 100 becomes the same as circuit 100A in FIG. 6A. For simplicity in description, identical components in the figures of this application are labeled by the same reference symbols. For the purpose of discussion, it is assumed that during the time period immediately before time T1, the outputs SAM(+)' and SAM(−)' are at Vp, −Vp, respectively, the inputs REZ(+), REZ(−) inputs at V, −V, respectively, and a single-ended voltage Vaux is applied to capacitor C5 as shown in FIG. 6A.

To simplify discussion, it is assumed that capacitors C1–C8 each has capacitance C. Therefore, the electrical charges on the lefthand and righthand plates of each of the eight capacitors are readily calculated for circuit 100A in FIG. 6A; the values of these charges are listed in the table in FIG. 6D. During the time period T2 in FIG. 2, all the switches S1, S2 are open, so that circuit 100 of FIG. 5 becomes circuit 100B of FIG. 6B. The opening of switches S1 does not cause any current so that the electrical charges on both plates of the eight capacitors retain the values shown in the table of FIG. 6D.

Figure 6C:
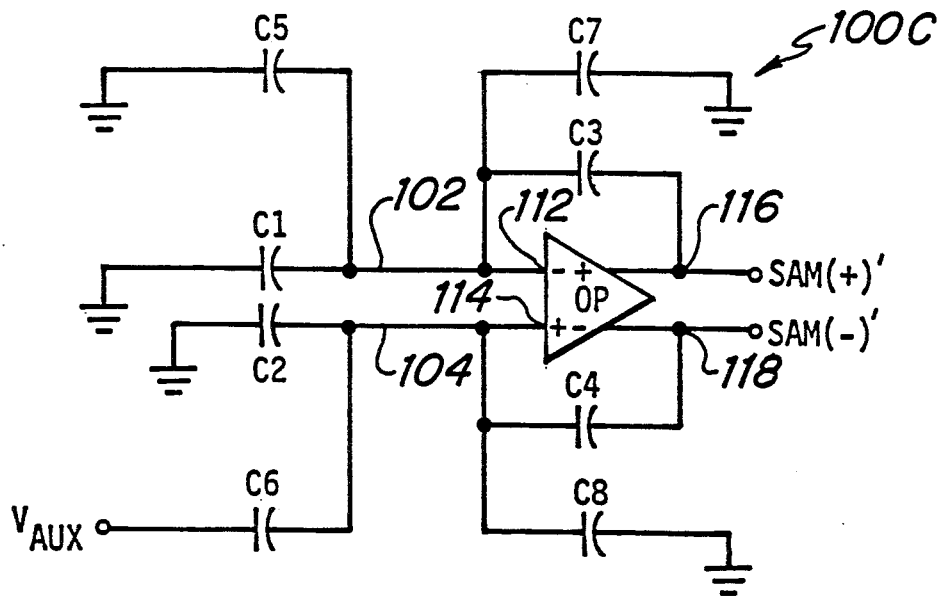

During time T3, switches S2 are closed and switches S1 are open, so that circuit 100 of FIG. 5 becomes the same as circuit 100C of FIG. 6C. At time T1 in reference to FIG. 6A, paths 102, 104 are connected respectively to the outputs 116, 118 of amplifier OP. During the time period T2, the two paths 102, 104 are not connected to the amplifier at all. During time T3, paths 102, 104 are connected to inputs 112, 114 respectively of the amplifier, instead of to the outputs.

Due to the conservation of electrical charges, the sum total of the electrical charges on the righthand plates of capacitors C5, C1 and the lefthand plates of capacitors C7, C3 will remain the same during the time periods T1, T2 and T3, since essentially no current flows into or out of input 112 of the amplifier OP. During time period T1 in reference to FIG. 6A, the sum total of electrical charges on the above-referenced plates of capacitors C1, C3, C5 and C7 are as follows:

$$C(Vp-V)+C(\Delta V-Vp)+C(Vp-Vaux)+C(-Vp)=C(-V-Vaux+\Delta V) \quad (5)$$

During time period T3 in reference to FIG. 6C, since the lefthand plates of capacitors C1 and C5 and the righthand plate of capacitor C7 are grounded; therefore, the electrical charges on the righthand plates of capacitors C1, C5 and the lefthand plate on capacitor C7 are each $C\Delta V$. Therefore, the electrical charge on the lefthand plate of capacitor C3 is:

$$C(-V-Vaux+\Delta V)-3C\Delta V=C(-V-Vaux-2\Delta V) \quad (6)$$

The electrical charge on the righthand plate of capacitor C3 is $(V+Vaux+2\Delta V)$. Hence the output SAM(+)' is $V+Vaux+3\Delta V$, since the amplifier OP adds another offset voltage $\Delta V$. Similarly, according to the table in FIG. 6D, the sum total of electrical charges on the righthand plates of C2, C6 and on the lefthand plates of C4, C8 at time T1 is:

$$C(-Vp+V)+C(\Delta V+Vp)+C(-Vp)+C(Vp)=C(V+\Delta V) \quad (7)$$

During time period T3, charges on the righthand plate of C2 and on the lefthand plate of C8 are each $C\Delta V$ and that on the righthand plate of capacitor C6 is $C(\Delta V-Vaux)$, so that the lefthand plate of C4 has an electrical charge whose value is:

$$C(V+\Delta V)-2C\Delta V-C(\Delta V-Vaux)=C(V+Vaux-2\Delta V) \quad (8)$$

Thus the righthand plate of C4 has an electrical charge whose value is $-V-Vaux+2\Delta V$. The output SAM(−)' is $-V-Vaux+3\Delta V$, since the amplifier OP introduces an additional offset voltage $\Delta V$.

Therefore, the potential difference between the two outputs SAM(+)' and SAM(−)' is:

$$(V+Vaux+3\Delta V)-(-V-Vaux+3\Delta V)=2(V+Vaux) \quad (9)$$

Hence circuit 100 in the above-described operation permits the adjustment of the potential difference between the two outputs by adding the auxiliary voltage Vaux.

The above calculations will not be affected significantly by the value of $\Delta V$ becoming a large value and the embodiment shown in FIG. 5 is offset independent. If enough input power is applied to the fully differential sample and hold circuit, circuit 100 of FIG. 5 can be further simplified in the form of circuit 200 shown in FIG. 7, which is a schematic circuit diagram of a fully differential sample and hold circuit 200 to illustrate a second embodiment of the invention.

Figure 7:
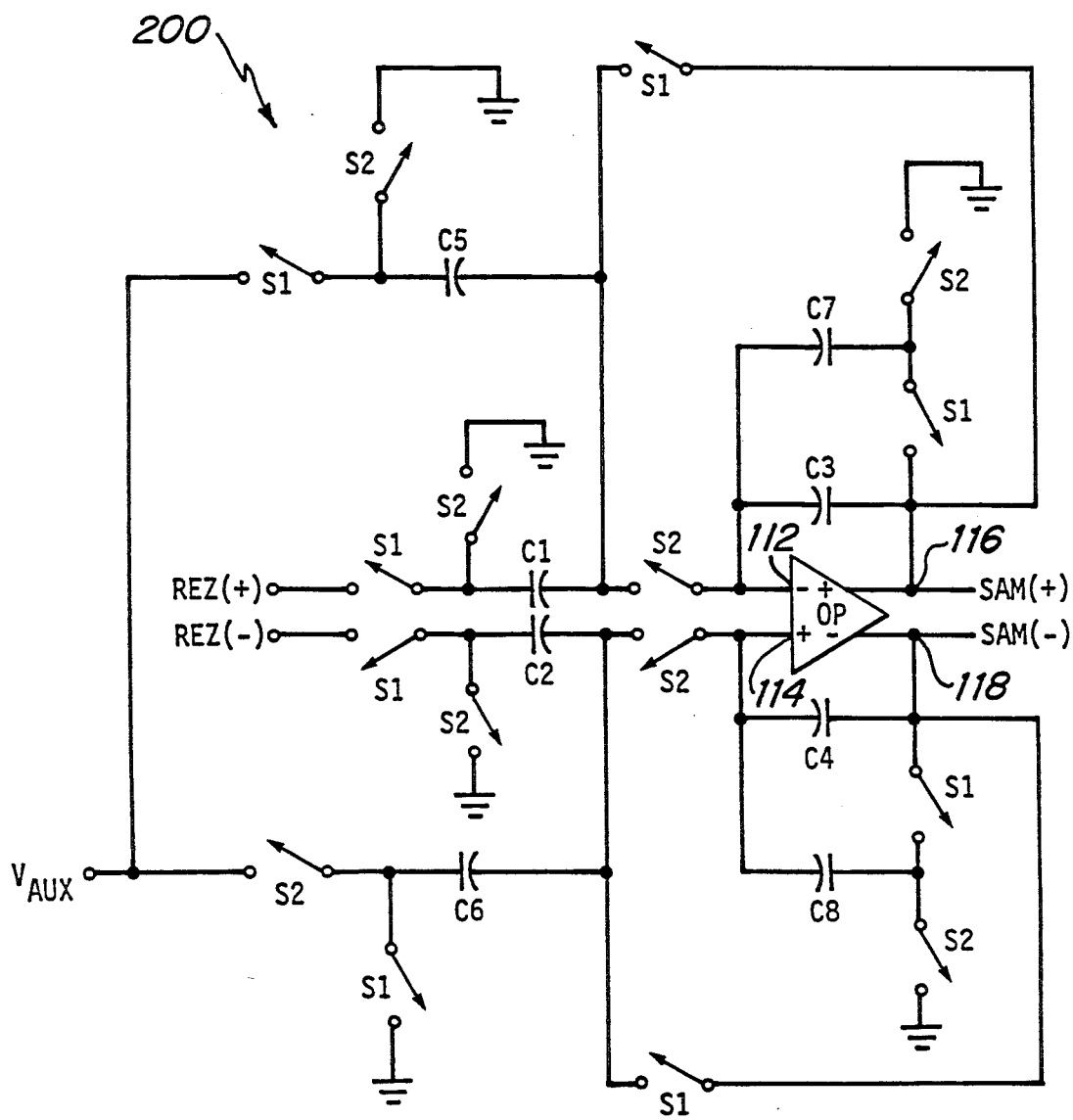
FIG. 7 is a schematic circuit diagram of a fully differential sample and hold adder circuit to illustrate a second embodiment of the invention.
Figures 8A, 8D:
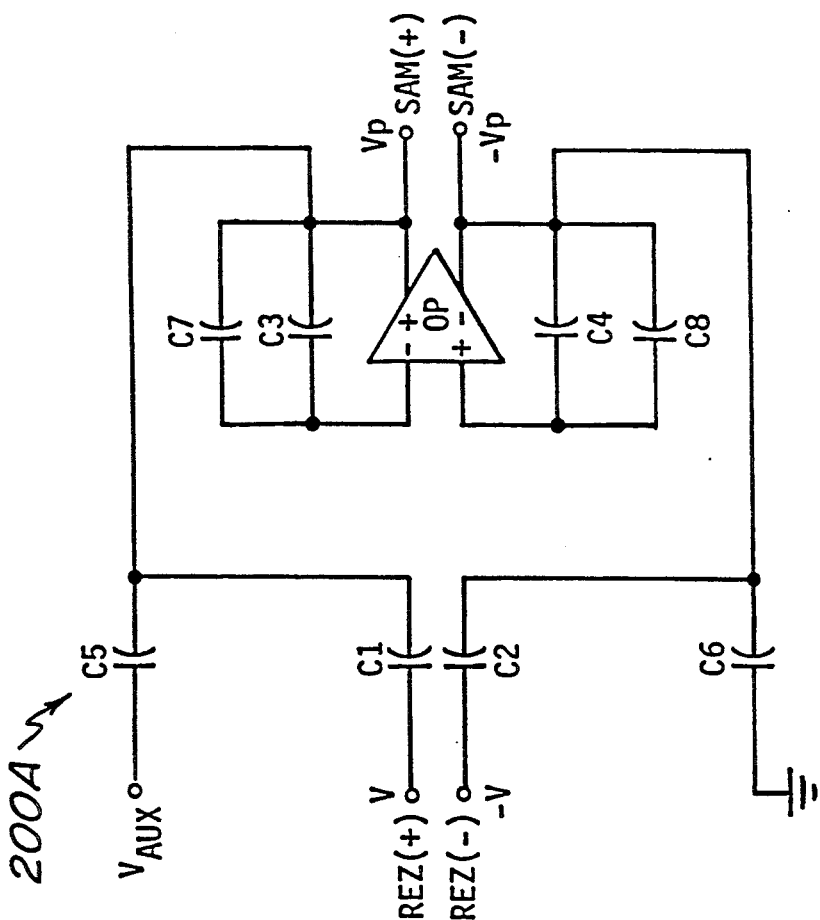
FIG. 8A-8C are schematic circuit diagrams illustrating the operation of the circuit of FIG. 7.
FIG. 8D is a table illustrating the electrical charges on capacitors C1-C8 in the circuit of FIG. 8A.
Figure 8B:
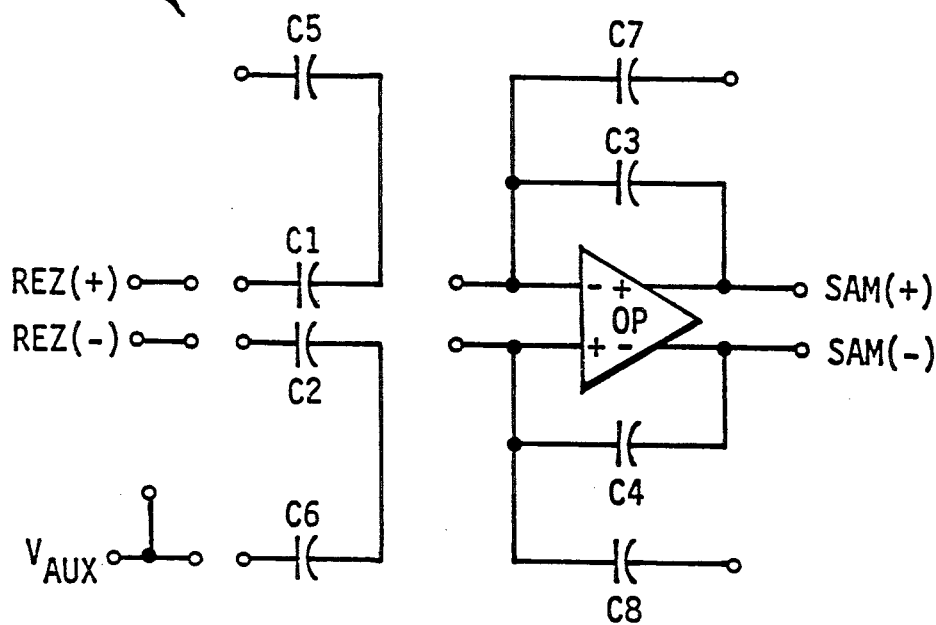
Figure 8C:
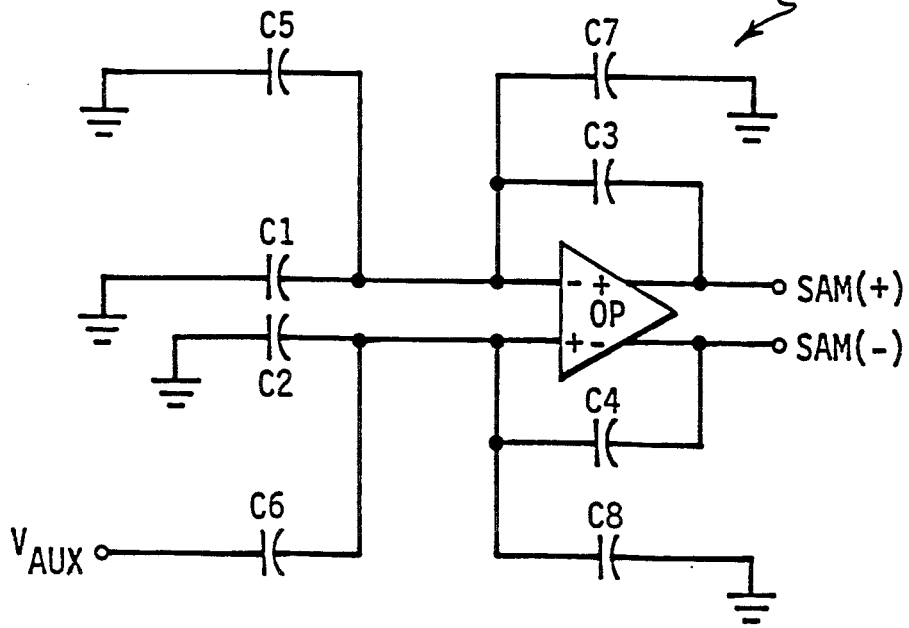

In comparison to circuit 100 in FIG. 5, the switches to the left of capacitors C3, C7, C4 and C8 have been omitted and the lefthand plates of these capacitors in circuit 200 are always connected to inputs 112 and 114 as shown in FIG. 7. Switches S1, S2 of circuit 200 are operated by non-overlapping clocks S1, S2 shown in FIG. 2, so that during times T1, T2 and T3, circuit 200 becomes respectively circuits 200A, 200B and 200C shown in FIGS. 8A, 8B and 8C. In a similar manner, the electrical charges on both plates of the eight capacitors during time T1 may be calculated and are listed in the table of FIG. 8D. During time T2, all the switches are open, but the electrical charges on the two plates of the eight capacitors retain their values so that they are the same as those listed in the table in FIG. 8D.

During time period T3, switches S2 are closed. During this time, the electrical charges on the righthand plates of capacitors C1, C5 and the lefthand plate of capacitor C7 are each $C\Delta V$. Again applying the principle of conservation of electrical charges, the electrical charge on the lefthand plate of capacitor C3 may be calculated in the same manner as before:

$$C(Vp-V)+C(\Delta V-Vp)+C(Vp-Vaux)+C(\Delta V-Vp)-3C\Delta V=C(-V-Vaux-\Delta V) \quad (10)$$

Thus the electrical charge on the righthand plate of capacitor C3 is $V+Vaux+\Delta V$; the output SAM(+) has the value $V+Vaux+2\Delta V$, where an additional $\Delta V$ is introduced by amplifier OP.

Similarly, the electrical charge on the righthand plate of capacitor C4 is given by:

$$C(-Vp+V)+C(\Delta V+Vp)+C(-Vp)+C(\Delta V+Vp)-2\Delta V-C(\Delta V-Vaux)=C(V+Vaux-\Delta V) \quad (11)$$

Hence the charge on the lefthand plate of capacitor C4 is $-V-Vaux+\Delta V$; the output SAM(+)' has the value $-V-Vaux+2\Delta V$, where again the amplifier OP introduces an additional offset voltage $\Delta V$. Hence the potential difference between the two outputs is again $2(V+Vaux)$. Therefore, circuit 200 in the above-described control system again permits the differential output potential to be adjusted by adding Vaux thereto.

In comparison to circuit 100 of FIG. 5, circuit 200 requires even fewer components and is therefore even cheaper to manufacture.

Here, in deriving equations 5-11, we are assuming that all the capacitances used have the same value C. However, the principle underlying this invention can still be applied even when the capacitances are different. In such event, the potential difference between the outputs of the operational amplifier is $aV+bVaux$, where a, b are constants whose values are determined by the values of the capacitances of capacitors $C_1-C_8$.

The invention has been described by reference to particular embodiments. It will be understood that various modifications may be made in the implementations of the invention, the scope of which is limited only by the appended claims.

What is claimed is:

1. A fully differential sample and hold adder circuit comprising:

an operational amplifier having a first output, a second output, a first input and a second input;

a first capacitor (C1) and a second capacitor (C5) for coupling respectively a first and a second circuit input to a first path;

a third capacitor (C2) and a fourth capacitor (C6) for coupling respectively a third and a forth circuit input to a second path;

a first feedback means comprising a fifth capacitor (C3) coupled between the first input and the first output of the amplifier;

a second feedback means comprising a sixth capacitor (C4) coupled between the second input and the second output of the amplifier;

a seventh capacitor (C7) and an eighth capacitor (C8); and a plurality of switches each having a first position and a second position, said plurality of switches coupling a single-ended voltage (Vaux) and a voltage (V) to the first and second circuit inputs respectively, coupling respectively a second voltage (−V) and a reference voltage to the third and fourth circuit inputs, coupling the seventh capacitor between the first amplifier output and reference voltage or the first amplifier input, coupling the eighth capacitor between the second amplifier output and the reference voltage or the second amplifier input, and coupling the first and the second paths to the first and second amplifier outputs, respectively, when the plurality of switches are each in the first position;

said plurality of switches coupling the first, second and third circuit inputs to the reference voltage and the fourth circuit input to the single-ended voltage (Vaux), coupling the first and second paths to the first and second amplifier inputs respectively, coupling the seventh capacitor between the first amplifier input and the reference voltage, and coupling the eighth capacitor between the second amplifier input and the reference voltage when the plurality of switches are in the second position.

2. The circuit of claim 1, wherein the plurality of switches disconnect the first, second and third and fourth capacitors from the first, second, third and fourth circuit inputs, respectively, and from the first and second paths, and the plurality of switches disconnect the seventh and eight capacitors from the amplifier inputs and outputs when the position of the plurality of switches changes from the first position to the second position.

3. The circuit of claim 1, further comprising means coupled to the each of the plurality of switches for providing two non-overlapping clock signals for operating the change of positioning of the plurality of switches.

4. The circuit of claim 1, wherein the plurality of switches couple the seventh capacitor between the first amplifier output and the reference voltage, and couple the eighth capacitor between the second amplifier output and the reference voltage when the plurality of switches are in the first position.

5. The circuit of claim 1, wherein the seventh capacitor is directly connected to the first amplifier input when the plurality of switches are in the first position and the eighth capacitor is directly connected to the second amplifier input when the plurality of switches are in the second position.

* * * * *